(12) United States Patent
Cho et al.

(10) Patent No.: US 12,183,780 B2
(45) Date of Patent: Dec. 31, 2024

(54) METAL-TO-SEMICONDUCTOR CONTACT INCLUDING A 2D CRYSTAL MATERIAL LAYER

(71) Applicant: Samsung Electronics Co., Ltd., Suwon-si (KR)

(72) Inventors: Yeonchoo Cho, Seongnam-si (KR); Kyung-Eun Byun, Seongnam-si (KR); Keunwook Shin, Yongin-si (KR); Hyeonjin Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 258 days.

(21) Appl. No.: 17/465,213

(22) Filed: Sep. 2, 2021

(65) Prior Publication Data

US 2022/0246718 A1  Aug. 4, 2022

(30) Foreign Application Priority Data

Jan. 29, 2021 (KR) .......................... 10-2021-0013474

(51) Int. Cl.
*H01L 29/04* (2006.01)
*H01L 23/522* (2006.01)
*H01L 29/16* (2006.01)
*H01L 29/161* (2006.01)
*H01L 29/49* (2006.01)
*H01L 29/78* (2006.01)

(52) U.S. Cl.
CPC .......... *H01L 29/04* (2013.01); *H01L 23/5228* (2013.01); *H01L 29/1606* (2013.01); *H01L 29/1608* (2013.01); *H01L 29/161* (2013.01); *H01L 29/4925* (2013.01); *H01L 29/7839* (2013.01)

(58) Field of Classification Search
CPC .......................... H01L 23/5228; H01L 29/7839
See application file for complete search history.

(56) References Cited

U.S. PATENT DOCUMENTS 9,306,005 B2  4/2016  Byun et al.
10,522,664 B2  12/2019  Byun et al.
(Continued)

FOREIGN PATENT DOCUMENTS

CN  103311276 B  1/2016
CN  102683217 B  6/2016
(Continued)

OTHER PUBLICATIONS

Eves, B.J. et al., Formation and reactivity of high quality halogen terminated Si(1,1,1) surfaces, 2005, Surface Science, pp. L89-L96 (Year: 2005).*

(Continued)

*Primary Examiner* — Tucker J Wright
(74) *Attorney, Agent, or Firm* — Harness, Dickey & Pierce, P.L.C.

(57) ABSTRACT

A semiconductor device is provided. The semiconductor device includes a metal layer, a semiconductor layer in electrical contact with the metal layer, a two-dimensional (2D) material layer disposed between the metal layer and the semiconductor layer and having a 2D crystal structure, and a metal compound layer disposed between the 2D material layer and the semiconductor layer.

17 Claims, 8 Drawing Sheets

(56) References Cited

U.S. PATENT DOCUMENTS

| | | |
|---|---|---|
| 10,559,660 B2 | 2/2020 | Lee et al. |
| 2012/0313092 A1* | 12/2012 | Shieh ................... H01L 21/428 |
| | | 257/E29.296 |
| 2019/0148493 A1* | 5/2019 | Lee ................... H01L 21/02491 |
| | | 257/27 |
| 2020/0243676 A1* | 7/2020 | Tomida ................... H01L 21/28 |
| 2020/0388680 A1 | 12/2020 | Lee et al. |
| 2022/0140100 A1* | 5/2022 | Cho ....................... B82Y 10/00 |
| | | 257/288 |

FOREIGN PATENT DOCUMENTS

| | | |
|---|---|---|
| KR | 10-2015-0062656 A | 6/2015 |
| KR | 10-2016-0137298 A | 11/2016 |

OTHER PUBLICATIONS

Min-Hyun Lee, et al. "Two-Dimensional Materials Inserted at the Metal/Semiconductor Interface: Attractive Candidates for Semiconductor Device Contacts," Nano Letters, American Chemical Society, pp. 1-7 (2018).

* cited by examiner

FIG. 6

| ELEMENT | REACTION ENERGY (eV) |
|---|---|
| Si (ref.) | 0.15 |
| Mo | 0.47 |
| W | 0.62 |
| Ta | 1.25 |
| Zr | 1.47 |
| Hf | 1.65 |

METAL-TO-SEMICONDUCTOR CONTACT INCLUDING A 2D CRYSTAL MATERIAL LAYER

CROSS-REFERENCE TO RELATED APPLICATION

This application is based on and claims priority under 35 U.S.C. § 119 to Korean Patent Application No. 10-2021-0013474, filed on Jan. 29, 2021, in the Korean Intellectual Property Office, the disclosure of which is incorporated by reference herein in its entirety.

BACKGROUND

Some example embodiments relate to a semiconductor device, and more particularly, to a semiconductor device in which a contact resistivity is reduced.

Semiconductor devices may include a junction between a metal and a semiconductor in a certain portion of the semiconductor to exchange electrical signals with the outside. This may be because metals have relatively lower resistance than semiconductors and/or may facilitate wiring to the outside. In this case, however, a contact resistance, e.g., a Schottky resistance, may occur due to a heterojunction of the semiconductor and metal.

In order to reduce the contact resistivity, various methods of lowering the Schottky energy barrier between semiconductors and metals have been proposed. For example, a metal having a work function of about 4 eV may be used for an n-type semiconductor (e.g. a semiconductor heavily doped with n-type impurities such as phosphorus and/or arsenic), and a metal having a work function of about 5 eV may be used for a p-type semiconductor (e.g. a semiconductor heavily doped with p-type impurities such as boron) in some cases. However, a phenomenon in which a work function of a metal is pinned on a surface of semiconductor may occur, which causes a limitation in lowering the Schottky energy barrier regardless of the type of metals. Alternatively or additionally, a depletion width may be reduced by doping a surface of the semiconductor in contact with the metal at a high concentration. However, as smaller semiconductor devices are used/required, the doping concentration may need to be further increased, however a method of increasing the doping concentration, a method of stably maintaining a doped state, and/or a reduction in the depletion width based on an increase in the doping concentration have limitations.

SUMMARY

Provided is a semiconductor device in which a contact resistivity is reduced by forming or including a two-dimensional (2D) material layer.

Provided is a semiconductor device in which a contact resistivity is reduced by inhibiting formation of a semiconductor oxide.

Additional or alternative aspects will be set forth in part in the description which follows and, in part, will be apparent from the description, or may be learned by practice of example embodiments of the disclosure.

According to some example embodiments, a semiconductor device includes: a metal layer; a semiconductor layer in electrical contact with the metal layer; a two-dimensional (2D) material layer disposed between the metal layer and the semiconductor layer and having a 2D crystal structure; and a metal compound layer disposed between the 2D material layer and the semiconductor layer.

The metal compound layer may be or may include a metal oxide.

A reaction energy between a metal included in the metal compound layer and oxygen may be greater than a reaction energy between a semiconductor included in the semiconductor layer and oxygen.

A difference between the reaction energy between the metal included in the metal compound layer and oxygen and the reaction energy between the semiconductor included in the semiconductor layer and oxygen may be 2 (eV) or less A metal included in the metal compound layer may include at least one of magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), and ruthenium (Ru).

A thickness of the metal compound layer may be 5 nm or less.

The metal compound layer may be or may include a metal-semiconductor compound.

A semiconductor included in the metal semiconductor compound may be the same as a semiconductor included in the semiconductor layer.

The 2D material layer may be in contact with both the metal layer and the metal compound layer.

The metal layer may include first and second metal layers spaced apart from each other.

The semiconductor device may further include: an insulating layer disposed on the semiconductor layer; and an electrode disposed on the insulating layer.

The 2D material layer may include at least one of graphene and nanocrystalline graphene (nc-G).

The 2D material layer may include a transition metal dichalcogenide (TMD), which is a compound of a transition metal and a chalcogen element.

The TMD may include at least one of, or all of, $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

The 2D material layer may include at least one of $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, InTe, hexagonal BN (h-BN), and phosphorene.

The 2D material layer may have a doped structure by substituting some of elements constituting the 2D crystal structure with other elements or by additionally combining another element to the 2D crystal structure.

A thickness of the 2D material layer may be a multiple, e.g. an integer multiple, of a thickness of a 2D crystal structure of a single layer.

The semiconductor layer may include at least one of silicon, germanium, a Group III-V compound semiconductor, a Group II-VI compound semiconductor, a Group IV-VI compound semiconductor, a group IV-IV compound semiconductor, an oxide semiconductor, and a semiconductor having a 2D crystal structure having a band gap.

A surface of the semiconductor layer in electrical contact with the metal layer may be treated with or may include an element having electron affinity of 4 (eV) or more.

The element of the surface-treated semiconductor layer may include a halogen element.

BRIEF DESCRIPTION OF THE DRAWINGS

The above and other aspects, features, and/or advantages of certain example embodiments of the disclosure will be more apparent from the following description taken in conjunction with the accompanying drawings, in which:

FIG. 6 is a diagram illustrating a reaction energy of each material according to some example embodiments.

DETAILED DESCRIPTION OF SOME EXAMPLE EMBODIMENTS

Figure 1:
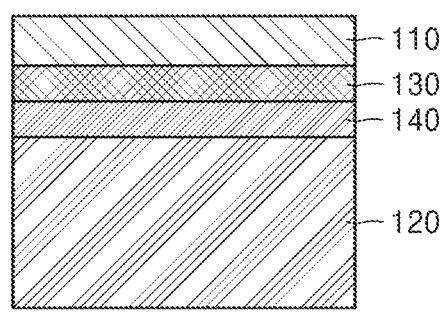
FIG. 1 is a cross-sectional view schematically illustrating a structure of a semiconductor device according to some example embodiments.

Reference will now be made in detail to some example embodiments, some examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a semiconductor device including a metal-semiconductor junction will be described in detail with reference to the accompanying drawings. Example embodiments described herein are merely examples, and various modifications may be made from various example embodiments. In the following drawings, like reference numerals refer to like components, and the size of each component in the drawings may be exaggerated for clarity and convenience of description.

When the description indicates that a certain component is "above" or "on" another component, the certain component may be directly above another component, or a third component may be interposed therebetween.

Terms such as first, second, etc., may be used to describe various components, and here, the above terms are used only for the purpose of distinguishing one component from another. These terms are not intended to limit differences in materials or structures of components.

The singular expressions include plural expressions unless the context clearly dictates otherwise. When a part "includes" a component, the "includes" may indicate that the part does not exclude another component but may further include another component, unless otherwise stated.

The use of the terms "a" and "an" and "the" and similar referents may cover both the singular and the plural.

FIG. 1 is a cross-sectional view schematically illustrating a structure of a semiconductor device according to some example embodiments. Referring to FIG. 1, a semiconductor device 100 according to some example embodiments may include a metal layer 110, a semiconductor layer 120 in electrical contact with (e.g. contacting or directly contacting) the metal layer 110, a two-directional (2D) metal layer 130 disposed between (e.g. directly between) the metal layer 110 and the semiconductor layer 120 and having a 2D crystal structure, and a metal compound layer 140 disposed between (e.g. directly between) the 2D material layer 130 and the semiconductor layer 120.

The metal layer 110 may include a metal. For example, the metal layer 110 may include at least one of magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), or alloys thereof.

The semiconductor layer 120 may be in electrical contact with the metal layer 110 and may be or may include a semiconductor. For example, the semiconductor layer 120 may be or may include a Group IV semiconductor such as silicon (Si) and germanium (Ge), a Group III-V compound semiconductor such as GaAs and GaP, a Group II-VI compound semiconductor such as CdS and ZnTe, a Group IV-VI compound semiconductor such as PbS, a Group IV-IV compound semiconductor such as SiC, an oxide semiconductor such as IGZO, or a semiconductor having a 2D crystal structure having a band gap such as $MoS_2$.

The 2D material layer 130 is disposed between the metal layer 110 and the semiconductor layer 120 and may have a 2D crystal structure.

Since the 2D material layer 130 includes a 2D material having a 2D crystal structure, the 2D material layer 130 may be formed in a layered structure, e.g. in mono-layer or poly-layer structure. Layers of the 2D material layer 130 may interact with each other through van der Waals bonding. Accordingly, since the 2D material layer 130 may be formed in a layer unit, the 2D material layer may be easy to adjust in thickness.

The 2D material layer 130 may include a carbon-based 2D material or a non-carbon-based 2D material. The carbon-based 2D material may include a crystal of a carbon element, such as graphene and/or nanocrystalline graphene (nc-G). Graphene may be formed by chemical vapor deposition (CVD) on a catalyst metal layer, requires or uses a high-temperature process at about 700° C. to 1000° C., and has a grain size of about a few μm. Since general graphene may be grown on a metal layer such as nickel (Ni) or copper (Cu), graphene may be transferred to another layer such as the semiconductor layer 120 after growth. Meanwhile, nanocrystalline graphene may be formed by inductively coupled plasma CVD (ICP-CVD) and/or plasma enhanced CVD (PE-CVD) at a relatively low temperature of about 600° C. or lower and may have a particle diameter of about 100 nm or less. Nanocrystalline graphene may be grown at low temperatures even on a semiconductor layer such as silicon.

The non-carbon-based 2D material is a 2D material including elements other than carbon. The non-carbon-based 2D material representatively includes a transition metal dichalcogenide (TMD), which is a compound of a transition metal and a chalcogen element. For example, TMD may include at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, $SnTe_2$. In addition to the TMD, there are various non-carbon-based 2D materials. For example, non-carbon-based 2D materials may include at least one of hexagonal BN (h-BN), phosphorene, $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, InTe, etc. h-BN is formed in a hexagonal crystal structure by bonding boron (B) and nitrogen (N). Phosphorin is a 2D allotrope of black phosphorus.

Any of, e.g. one or more of, the aforementioned materials may be used as the 2D material layer 130, but when the semiconductor layer 120 has a 2D crystal structure, a material of the 2D material layer 130 may be selected to be different from a material of the semiconductor layer 120.

Further, the 2D material layer 130 may include the aforementioned materials and may be doped, which may further improve electrical characteristics of the semiconductor device 10. For example, the 2D material layer 130 may have a doped structure obtained by substituting some of elements constituting or included in the 2D crystal structure with other elements, and/or by additionally combining another element to the 2D crystal structure. For example, when the 2D material layer 130 is graphene, some of the carbon atoms forming graphene may be substituted with other atoms such as boron and/or nitrogen, and/or some of the carbon atoms may be combined with other atoms such as boron or nitrogen. The added/substituted elements may be incorporated into the lattice, and/or may be interstitial.

Since the 2D material layer 130 does not have a reactor on a surface of the 2D material layer 130, a phenomenon in which a work function of the metal layer 110 is pinned on the surface of the semiconductor layer 120 may be eliminated or reduced in likelihood and/or impact of occurrence. Accordingly, an effect based on the inherent work function of the metal layer 110 may be exhibited, and as a result, a contact resistivity between the metal layer 110 and the semiconductor layer 120 may be lowered.

Figure 2A:
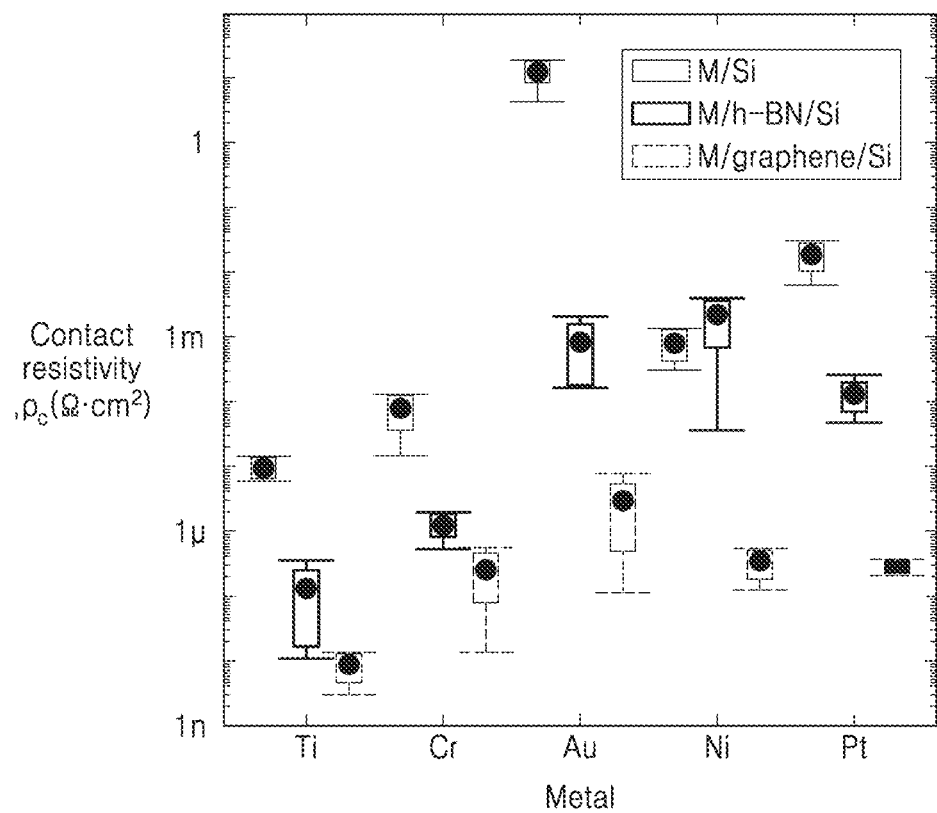
FIG. 2A is a result of measuring a contact resistivity of each metal according to some example embodiments.

FIG. 2A is a result of measuring a contact resistivity according to metals according to some example embodiments. A first example represents a contact resistivity of each metal when the metal layer 110 and the semiconductor layer 120 are in direct contact with each other, a second example, e.g. according to some example embodiments, represents a contact resistivity of each metal when the metal layer 110 and the semiconductor layer 12 are brought into electrical contact with each other using the 2D material layer 130 including h-BN, and a third example, e.g. according to some example embodiments, represents a contact resistivity of each metal when the metal layer 110 and the semiconductor layer 12 are brought into electrical contact with each other using the 2D material layer 130 including graphene.

As shown in FIG. 2A, the contact resistivity is reduced, e.g. reduced by one or more orders of magnitude, when the 2D material layer 130 is added between the metal layer 110 and the semiconductor layer 120, compared to a case in which the metal layer 110 is in direct contact with the semiconductor layer 120.

Figure 2B:
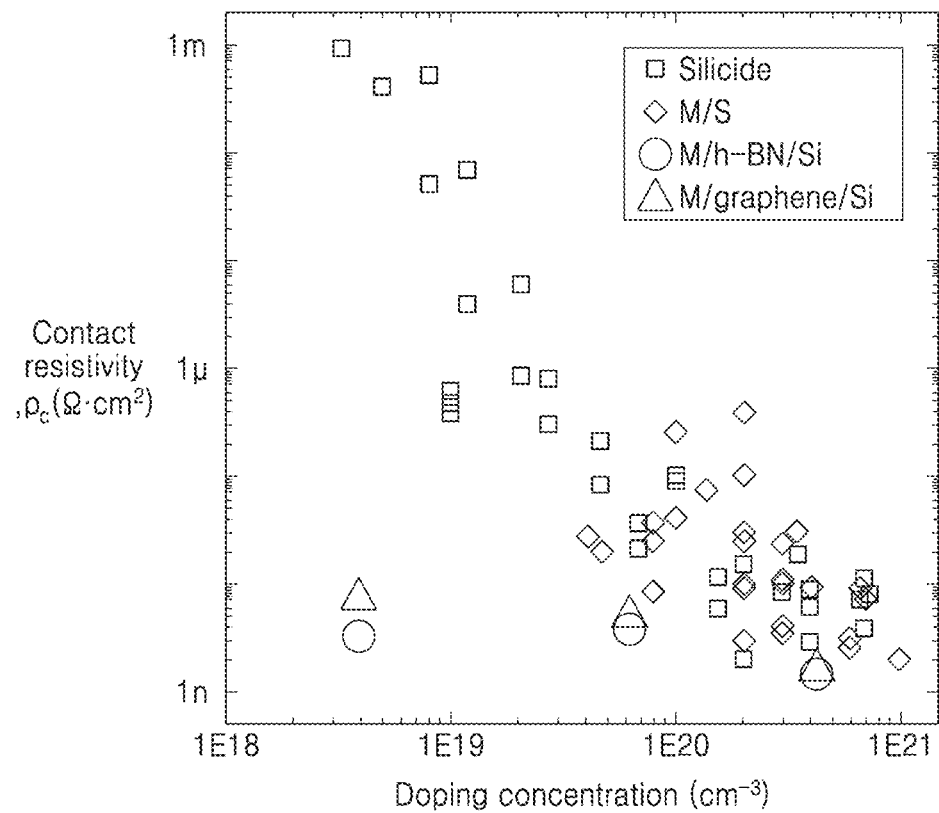
FIG. 2B is a result of measuring a contact resistivity over a doping concentration of a semiconductor layer according to some example embodiments.

FIG. 2B is a result of measuring a contact resistivity over a doping concentration of a semiconductor layer according to some example embodiments. As shown in FIG. 2B, the contact resistivity is reduced when the doping concentration in the semiconductor layer 120 is increased. In particular, when the 2D material layer 130 is additionally included between the metal layer 110 and the semiconductor layer 120, the contact resistivity is significantly reduced even if the doping concentration of the semiconductor layer 120 is not large. Thus, the contact resistivity of the semiconductor device may be reduced by adding the 2D material layer 130 between the metal layer 110 and the semiconductor layer 120.

Meanwhile, when the 2D material layer 130 is formed on the semiconductor layer 120, a semiconductor oxide film and/or the like may be formed on the semiconductor layer 120 due to the use of plasma and/or the like, e.g. plasma used during the deposition of the 2D material layer. The semiconductor oxide film described above may be a factor that may increase the contact resistivity.

Figure 3:
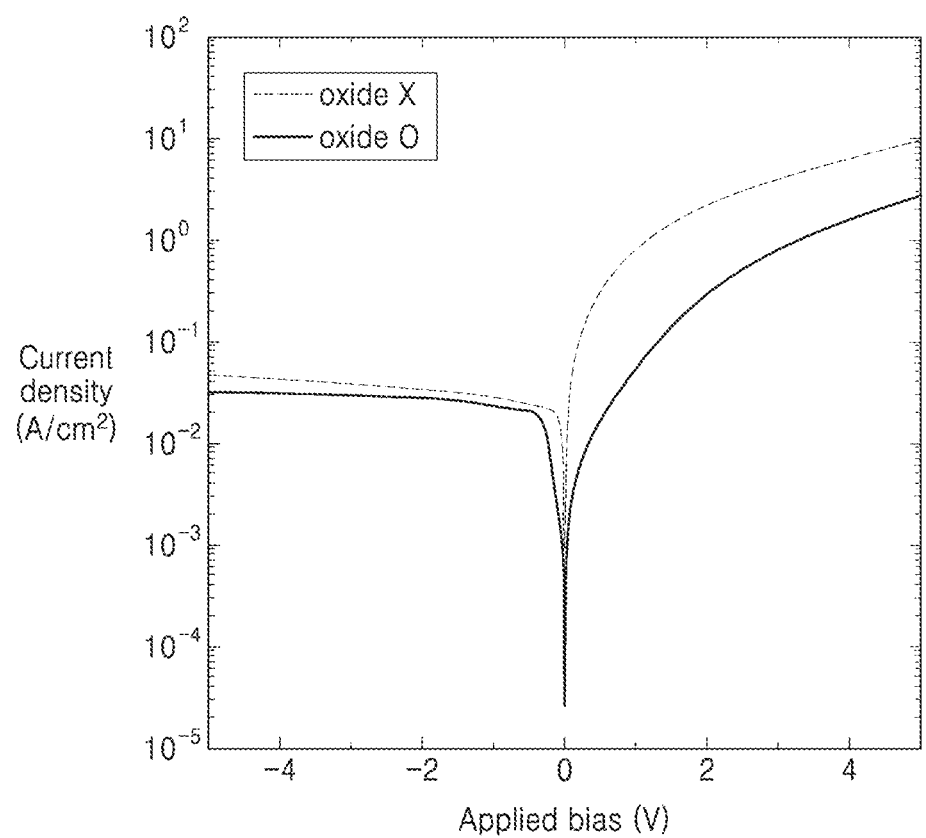
FIG. 3 is a result of measuring a current density based on an oxide film according to some example embodiments.

FIG. 3 shows a result of measuring a current density according to an oxide film according to some example embodiments. The metal layer 110 includes or is titanium (Ti) and the semiconductor layer 120 includes or is silicon (Si) (e.g. single crystal silicon). The semiconductor oxide film may be described as a native oxide film, and may be, for example, between 0.3 nm and 5 nm; however, example embodiments may not be limited. As shown in FIG. 3, a current density when the oxide film is formed between the metal layer 110 and the semiconductor layer 120 is lower than a current density when the oxide film is not formed between the metal layer 110 and the semiconductor layer 120. This means that the contact resistivity between the semiconductor layer 120 and the metal layer 110 is increased due to the oxide film. For example, electrons have to pass through an interface between the semiconductor layer 120 and the metal layer 110 by quantum-mechanical tunneling, but tunneling may be difficult as a thickness of the semiconductor oxide film increases.

The semiconductor device according to some example embodiments may further include a metal compound layer 140 between the semiconductor layer 120 and the 2D material layer 130 to prevent or reduce the likelihood or impact of an oxide film from being formed on the semiconductor layer 120. For example, the metal compound layer 140 may inhibit or help to inhibit any additional native oxidation from plasma processing and/or from the environment, such as from queueing time in an ambient atmosphere. The metal compound layer 140 may include a metal oxide. However, the metal compound layer 140 is not limited thereto. The metal compound layer 140 may further include a semiconductor compound, e.g., at least one of a metal silicide, silicon carbide, or the like.

A metal included in the metal compound layer 140 may be the same as the metal included in the metal layer 110, or may not be the same. For example, the metal compound layer 140 may include at least one of magnesium (Mg), aluminum (Al), scandium (Sc), titanium (Ti), vanadium (V), chromium (Cr), manganese (Mn), nickel (Ni), Copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), and ruthenium (Ru) or alloys including combinations of one or more thereof.

A semiconductor included in the metal compound layer 140 may be the same as the semiconductor included in the semiconductor layer 120, but example embodiments are not limited thereto.

The metal compound layer 140 may be formed in a process of forming a metal film on the semiconductor layer 120 and forming the 2D material layer 130 on the metal film. For example, the metal compound layer 140 and the 2D material layer 130 may be formed in-situ, at the same or similar times and/or with the same equipment. The metal film may be formed by at least one of atomic layer deposition, E-beam evaporator, sputtering, chemical vapor deposition, etc. The 2D material layer 130 may be transferred onto the metal layer 110 and/or may be deposited on the metal layer 110 through inductively coupled plasma CVD (ICP-CVD) and/or plasma enhanced CVD (PE-CVD) at low temperatures.

In the process of forming the 2D material layer 130 on the metal film, a reaction source such as at least one of carbon, hydrogen, or oxygen may react with the metal film to form the metal compound layer 140. In particular, oxygen that has approached the metal film reacts with the metal of the metal film to form a metal oxide, and thus, oxygen may be inhibited or partially inhibited from approaching the semiconductor layer 120. Thus, it is possible to inhibit or reduce the likelihood of or impact from a semiconductor oxide film from being formed on the semiconductor layer 120. Additionally or alternatively, some of metals of the metal layer may react with a material of the semiconductor layer 120 to form a metal-semiconductor compound. That is, the metal compound layer 140 may be considered to be a result produced in the process of inhibiting some of the reaction sources from reacting with a material of the semiconductor layer 120 in the process of forming the 2D material layer 130.

Figure 4:
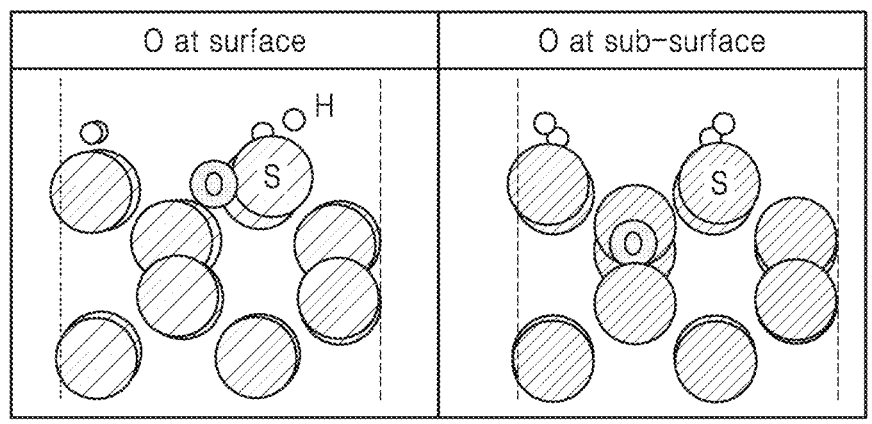
FIG. 4 is a reference diagram illustrating a process in which oxygen penetrates a semiconductor layer as a comparative example.

FIG. 4 is a reference diagram illustrating a process in which oxygen penetrates a semiconductor layer, as a comparative example. As shown in FIG. 4, when oxygen penetrates the surface of the semiconductor layer 120, oxygen may react with the semiconductor of the semiconductor layer 120 to form a semiconductor oxide. The semiconductor oxide described above may be a factor that increases a contact resistivity.

Figure 5:
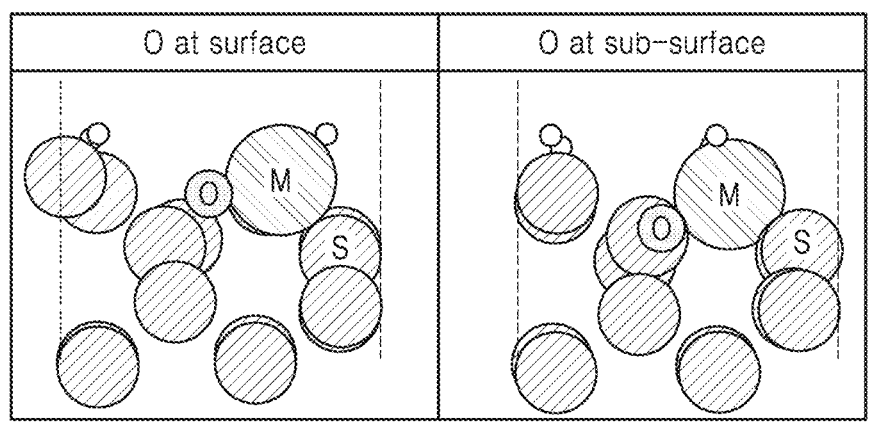
FIG. 5 is a reference diagram illustrating a process in which oxygen penetrates a semiconductor layer formed on a metal film according to some example embodiments.

FIG. 5 is a reference diagram illustrating a process in which oxygen penetrates a semiconductor layer formed on a metal film according to some example embodiments. As shown in FIG. 5, oxygen has to pass/diffuse through a metal film to penetrate the semiconductor layer 120. In the process in which oxygen passes through or diffuses through the metal film, oxygen may react with a metal having a reaction energy higher than that of a semiconductor to form a metal oxide. Accordingly, oxygen is bonded to the metal and no longer penetrates or diffuses into the semiconductor layer 120.

Meanwhile, since the metal compound layer 140 is formed from the metal film, a thickness of the metal compound layer 140 may be small. For example, the metal compound layer 140 may be about 5 nm or less. Since the metal compound is thin, the metal compound layer 140 may have a small or little energy band gap Thus, electrons may pass through the metal compound layer 140 without tunneling, so that a contact resistivity rarely increases due to the metal compound layer 140.

In order to inhibit or partially inhibit the formation of a semiconductor oxide film, the reaction energy between the metal of the metal film and oxygen is preferably higher than the reaction energy between the semiconductor of the semiconductor layer 120 and oxygen.

FIG. 6 is a diagram illustrating a reaction energy of each material with oxygen according to some example embodiments. As shown in FIG. 6, molybdenum (Mo), tungsten (W), tantalum (Ta), zirconium (Zr), and hafnium (Hf) have greater a reaction energy with oxygen than silicon (Si). Accordingly, since the metal having a reaction energy higher than the semiconductor of the semiconductor layer 120 first reacts with oxygen to form a compound, thereby preventing or reducing the likelihood of or impact from oxygen penetrating or diffusing into the semiconductor layer 120. However, as a reaction energy of the reaction in which oxygen moves from the metal to the semiconductor increases, the reaction is not thermodynamically preferred, and thus, a difference between the reaction energy between the metal included in the metal compound layer 140 and oxygen and the reaction energy between the semiconductor included in the semiconductor layer 120 and oxygen may be 2 (eV) or less.

A semiconductor device including the metal compound layer 140 may be realized as various devices. For example, an insulating layer, an electrode, etc. may be selectively added to the semiconductor device to realize a transistor, a light emitting device, a detection device, an interconnector, or the like.

Figure 7:
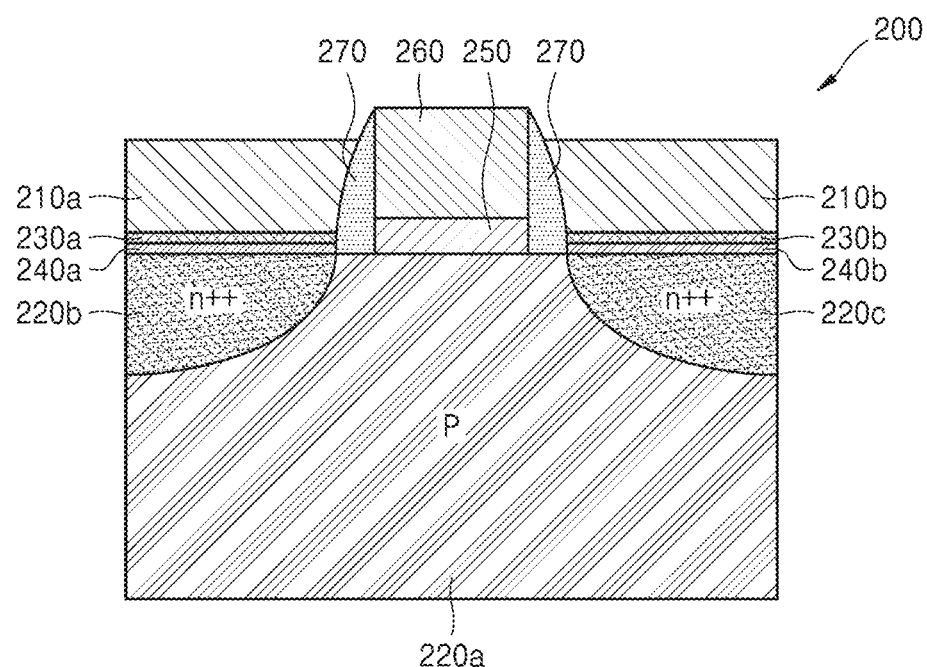
FIG. 7 is a diagram illustrating a semiconductor device realized as a transistor according to some example embodiments.

FIG. 7 is a diagram illustrating a semiconductor device 200 realized as a transistor according to some example embodiments. As shown in FIG. 7, the semiconductor device 200 may include first and second metal layers 210*a* and 210*b* spaced apart from each other, semiconductor layers 220*a*, 220*b*, and 220*c* 220*a* in electrical contact with the first and second metal layers 210*a* and 210*b*, and first and second 2D material layers 230*a* and 230*b* disposed between the first and second metal layers 210*a* and 210*b* and the semiconductor layers 220*a*, 220*b*, and 220*c*.

The first and second metal layers 210*a* and 210*b* may be a source electrode and a drain electrode of a transistor, respectively, and may correspond to the metal layer 110 illustrated in FIG. 1.

The semiconductor layers 220*a*, 220*b*, and 220*c* become a channel of the transistor and may correspond to the semiconductor layer 120 shown in FIG. 1. In some example embodiments, the semiconductor layers 220*a*, 220*b*, 220*c* may include, e.g., a well region 220*a* doped as a first conductivity type and a source region 220*b* and a drain region 220*c* doped as a second conductivity type electrically opposite to the first conductivity type. FIG. 7 illustrates that the well region 220*a* is doped as a p-type (e.g. boron) and the source and drain regions 220*b* and 220*c* are doped as an n-type (e.g. phosphorus and/or arsenic), but this is only an example and the well region 220*a* may be doped as an n-type and the source and drain regions 220*b* and 220*c* may be doped as a p-type. The well region 220*a* may be doped with a relatively low concentration, and the source and drain regions 220*b* and 220*c* may be doped with a relatively high concentration to reduce a depletion width. Furthermore there may be other regions, e.g. other counted regions such as halo and/or pocket regions (not illustrated); however, example embodiments are not limited thereto.

Meanwhile, first and second metal compound layers 240*a* and 240*b* may be further disposed between the semiconductor layers 220*b* and 220*c* and the first and second 2D material layers 230*a* and 230*b*. The first and second metal compound layers 240a and 240b may each include a metal oxide. The first and second metal compound layers 240a and 240b may further include a semiconductor compound, e.g., at least one of a metal silicide, a silicon carbide, or the like.

A metal included in the first and second metal compound layers 240a and 240b may be the same as the metal included in the first and second metal layers 210a and 210b, or may not be the same. A semiconductor included in the first and second metal compound layers 240a and 240b may be the same as the semiconductor included in the semiconductor layers 220b and 220c, but is not limited thereto.

The first and second metal compound layers 240a and 240b may be a result produced in the process of inhibiting a portion of a reaction source from reacting with a material of the semiconductor layer 120 in the manufacturing process of the semiconductor device 200 and may prevent or reduce the likelihood of and/or impact from an increase in contact resistivity due to a semiconductor oxide film (a native oxide film).

Alternatively or additionally, the semiconductor device may further include a gate insulating layer 250 disposed on the well region 220a between the source region 220b and the drain region 220c, a gate electrode 260 disposed on the gate insulating layer 250, and a spacer 270 surrounding sidewalls of the gate insulating layer 250 and the gate electrode 260. The spacer 270 may prevent or reduce the likelihood of and/or impact from the gate insulating layer 250 and the gate electrode 260 from directly contacting the first and second metal layers 210a and 210b. The gate insulating layer 250 may include $SiO_2$, $SiN_x$, $HfO_2$, $Al_2O_3$, or the like, and the gate electrode 260 may include doped or undoped polysilicon or the same metal material as that of the metal layer 110. The spacer 270 may include an insulating material such as $SiO_2$ or $SiN_x$.

The semiconductor device of FIG. 7 is a unipolar metal-oxide silicon field effect transistor (MOSFET) doped so that the well region 220a has polarity opposite to the source and drain regions 220b and 220c. However, the aforementioned principle is applicable to all semiconductor devices having heterojunctions between metals and semiconductors as well as unipolar MOSFETs. For example, even when all regions of the semiconductor layers 220a, 220b, and 220c are not doped or all regions of the semiconductor layers 220a, 220b, and 220c are doped with the same polarity (same conductivity type), a contact resistivity may be lowered by interposing the 2D material layers 230a and 230b between the metal layers 210a and 210b and the semiconductor layers 220b and 220c. Alternatively or additionally, since the metal compound layers 240a and 240b are disposed between the 2D materials 230a and 230b and the semiconductor layers 220b and 220c, an increase in contact resistivity due to the formation of a semiconductor oxide film may be inhibited.

Figure 8:
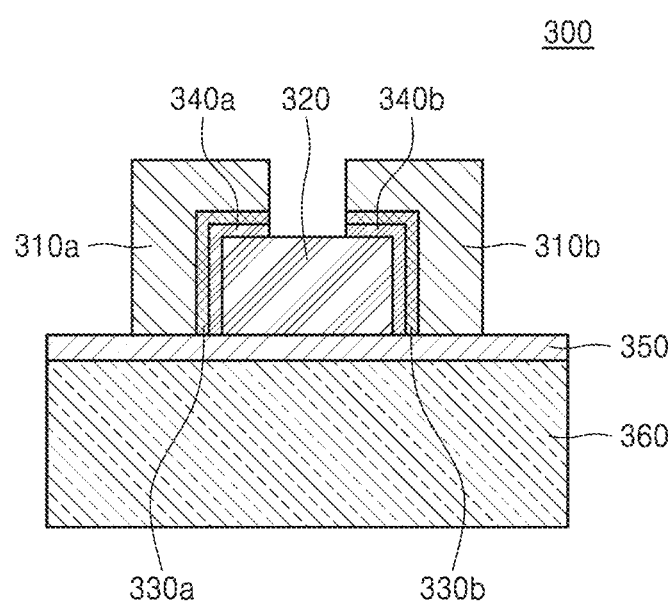
FIG. 8 is a cross-sectional view illustrating a schematic structure of a semiconductor device according to some example embodiments.

FIG. 8 is a cross-sectional view illustrating a schematic structure of a semiconductor device according to some example embodiments. Referring to FIG. 8, a semiconductor device 300 may include a gate electrode 360, a gate insulating layer 350 disposed on the gate electrode 360, a semiconductor layer 320 disposed on the gate insulating layer 350, first and second metal layers 310a and 310b disposed on both sides of the semiconductor layer 320 and being in electrical contact with the semiconductor layer 320, and 2D material layers 330a and 330b disposed between the semiconductor layer 320 and having a 2D crystal structure. Here, the semiconductor layer 320 serves as a channel layer and may be undoped.

The first and second metal layers 310a and 310b may be disposed on the gate insulating layer 350 and become a source electrode facing one side of the semiconductor layer 320, and may be disposed on the gate insulating layer 350 and become a drain electrode facing the other side surface of the semiconductor layer 320. Alternatively or additionally, the gate electrode 460 may also include a metal material. The gate electrode 360 and the first and second metal layers 310a and 310b may include the materials described above.

The 2D material layers 330a and 330b may include a first 2D material layer 330a disposed between the first metal layer 310a and one side of the semiconductor layer 320 and a second 2D material layer 330b disposed between the second metal layer 310b and the other side of the semiconductor layer 320. As shown in FIG. 8, the first 2D material layer 330a may extend from one side of the semiconductor layer 320 to a partial region of an upper surface of the semiconductor layer 320. Also, the second 2D material layer 330b may extend from the other side of the semiconductor layer 320 to another partial region of the upper surface and may not contact the first 2D material layer 330a. Accordingly, the 2D material layers 330a and 330b may be bent at about 90 degrees between the sides of the semiconductor layer 320 and the upper surface. These 2D material layers 330a and 330b may include the 2D crystal material described above. In particular, a non-carbon-based 2D crystal including crystals of elements other than carbon may be used as a material of the 2D material layers 330a and 330b.

The first and second metal compound layers 340a and 340b may be further disposed between the semiconductor layer 320 and the first and second 2D material layers 330a and 330b. The first and second metal compound layers 340a and 340b may each include a metal oxide. The first and second metal compound layers 340a and 340b may further include a semiconductor compound, e.g., at least one of a metal silicide, a silicon carbide, or the like.

A metal included in the first and second metal compound layers 340a and 340b may be the same as the metal included in the first and second metal layers 310a and 310b, or may not be the same. A semiconductor included in the first and second metal compound layers 340a and 340b may be the same as the semiconductor included in the semiconductor layer 320, but is not limited thereto.

The first and second metal compound layers 340a and 340b may be a result produced in the process of inhibiting a portion of a reaction source from reacting with a material of the semiconductor layer 320 in the manufacturing process of the semiconductor device 300, and may prevent an increase in contact resistivity due to a semiconductor oxide film.

Figure 9:
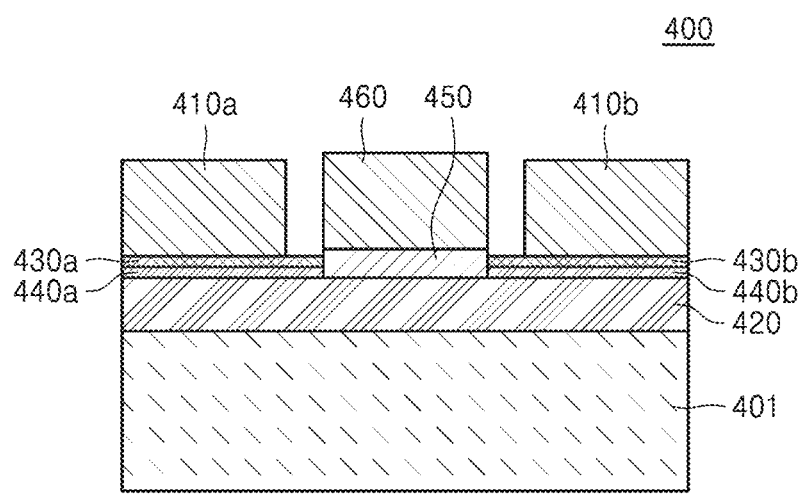
FIG. 9 is a cross-sectional view schematically illustrating a structure of a semiconductor device according to some example embodiments.

FIG. 9 is a schematic cross-sectional view of a structure of a semiconductor device 400 according to some example embodiments. The semiconductor device 300 of FIG. 8 has a lower gate structure in which the gate electrode 360 is disposed under the semiconductor layer 320, whereas the semiconductor device 400 shown in FIG. 9 has an upper gate structure. Referring to FIG. 9, the semiconductor device 400 may include a substrate 401, a semiconductor layer 420 disposed on an upper surface of the substrate 401, a gate insulating layer 450 disposed in a partial region of an upper surface of the semiconductor layer 420, a gate electrode 460 disposed on an upper surface of the gate insulating layer 450, 2D material layers 430a and 430b disposed in different regions of the upper surface of the semiconductor layer 420, and first and second metal layers 410a and 410b disposed on upper surfaces of the 2D material layers 430a and 430b. Here, the semiconductor layer 420 may serve as a channel layer and may be undoped.

The 2D material layers 430a and 430b may include a first 2D material layer 430a and a second 2D material layer 430b respectively disposed adjacent to both sides of the gate insulating layer 450 on the upper surface of the semiconductor layer 420. For example, the gate insulating layer 450 is disposed in a central region of the upper surface 122 of the semiconductor layer 420, and the first 2D material layer 430a and the second 2D material layer 430b may be disposed on both sides of the gate insulating layer 450 In FIG. 9, the first and second 2D material layers 430a and 430b are shown to completely contact the gate insulating layer 450, but the first and second 2D material layers 430a and 430b may be spaced apart from the gate insulating layer 450. In this case, the upper surface of the semiconductor layer 420 may be partially exposed between the gate insulating layer 450 and the first and second 2D material layers 430a and 430b.

In addition, the metal layers 410a and 410b may include a first metal layer 410a disposed on the first 2D material layer 430a and a second metal layer 410b disposed on the second 2D material layer 430b. The first and second metal layers 410a and 410b may be source and drain electrodes, respectively. Here, a material of the first and second metal layers 410a and 410b and the 2D material layers 430a and 430b may be the same as the material described above with reference to FIG. 8. As shown in FIG. 9, the metal layers 410a and 410b may be partially disposed on the first 2D material layer 430a and the second 2D material layer 430b, respectively, and may be spaced apart from the gate insulating layer 450. Accordingly, portions of the upper surfaces of the first 2D material layer 430a and the second 2D material layer 430b may be exposed. Alternatively, the first and second metal layers 410a and 410b may completely or nearly completely cover the entire surfaces of the first 2D material layer 430a and the second 2D material layer 430b.

First and second metal compound layers 440a and 440b may be further disposed between the semiconductor layer 420 and the first and second 2D material layers 430a and 430b. The first and second metal compound layers 440a and 440b may each include a metal oxide. The first and second metal compound layers 440a and 440b may further include a semiconductor compound, e.g., a metal silicide, a silicon carbide, or the like.

A metal included in the first and second metal compound layers 440a and 440b may be the same metal as the metal included in the first and second metal layers 410a and 410b or may not be the same. A semiconductor included in the first and second metal compound layers 440a and 440b may be the same as the semiconductor included in the semiconductor layer 420, but is not limited thereto.

The first and second metal compound layers 440a and 440b are a result produced in the process of inhibiting or reducing the likelihood of a portion of a reaction source from reacting with a material of the semiconductor layer 420 in the manufacturing process of the semiconductor device 400, and may prevent or reduce or mitigate an increase in contact resistivity due to a semiconductor oxide film.

Figure 10:
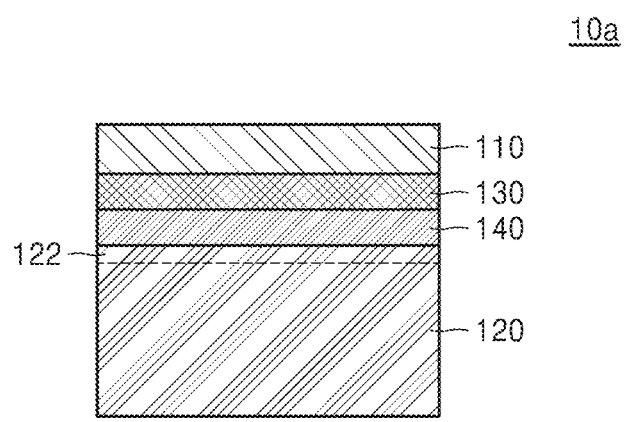
FIG. 10 is a diagram illustrating a semiconductor device realized as a light emitting device according to some example embodiments.

FIG. 10 is a diagram illustrating a semiconductor device realized as a light emitting device according to some example embodiments. As shown in FIG. 10, a semiconductor device 500 may include first and second metal layers 510a and 510b spaced apart from each other, first and second semiconductor layers 520a and 520b in electrical contact with the first and second metal layers 510a and 510b, respectively, first and second 2D material layers 530a and 530b disposed between the first metal layer 510a and the first semiconductor layer 520a and between the second metal layer 510b and the second semiconductor layer 520b, respectively, and an active layer 550 disposed between the first semiconductor layer 520a and the second semiconductor layer 520b.

The first and second metal layers 510a and 510b may each be an electrode of a light emitting device and may correspond to the metal layer 110 illustrated in FIG. 1.

The first semiconductor layer 520a may be disposed on the first metal layer 510a and may include, e.g., an n-type semiconductor. However, the first semiconductor layer 520a is not limited thereto, and in some cases, the first semiconductor layer 520a may include a p-type semiconductor. The first semiconductor layer 520a may include a Group III-V n-type semiconductor, e.g., n-GaN. The first semiconductor layer 520a may have a single layer or multilayer structure. For example, the first semiconductor layer 520a may include a semiconductor material of any one of InAlGaN, GaN, AlGaN, InGaN, AlN, and InN, and include a semiconductor layer 120 doped with a conductive dopant such as Si, Ge, Sn, etc.

The second semiconductor layer 520b may be disposed on the second metal layer 510b and may include a semiconductor layer 120 of a type different from the first semiconductor layer 520a. For example, the second semiconductor layer 520b may include a p-type semiconductor layer 120. The second semiconductor layer 520b may include, e.g., InAlGaN, GaN, AlGaN and/or InGaN, and may be a semiconductor layer 120 doped with a conductive dopant such as Mg.

The active layer 550 may be disposed between the first semiconductor layer 120 and the second semiconductor layer 120, may generate light as electrons and holes are combined with each other, and have a multi-quantum well (MQW) structure or a single quantum well (SQW) structure. The active layer 550 may include a Group III-V semiconductor, e.g., InGaN, GaN, AlGaN, AlInGaN, etc. A cladding layer (not shown) doped with a conductive dopant may be formed on and/or under the active layer 550. For example, the cladding layer may be realized as an AlGaN layer or an InAlGaN layer.

A first 2D material layer 530a may be disposed between the first metal layer 510a and the first semiconductor layer 520a, and a second 2D material layer 530b may be disposed between the second metal layer 510b and the second semiconductor layer 520b. The first and second 2D material layers 530a and 530b are the same as the 2D material layer 130 described above with reference to FIG. 1, and thus, a detailed description thereof will be omitted.

A first metal compound layer 540a may be disposed between the first semiconductor layer 520a and the second 2D material layer 530a, and a second metal compound layer 540b may be disposed between the second semiconductor layer 520b and the second 2D material layer 530b. The first and second metal compound layers 540a and 540b are the same as the metal compound layer 140 described above with reference to FIG. 1, and thus, a detailed description thereof will be omitted.

In FIG. 10, a semiconductor device operating as a light emitting device has been described, but example embodiments are not limited thereto. The semiconductor device may also act as a detector.

In a semiconductor device, a surface of the semiconductor layer 120 in electrical contact with the metal layer 110 may be surface-treated with an element having a high electron affinity.

The surface-treated element may have an electron affinity of 4 (eV) or more. By surface-treating the surface of the semiconductor layer 120 with an element having a high electron affinity, the surface of the semiconductor layer 120 has an increased electron dipole. Thus, a Schottky energy barrier at an interface between the metal layer 110 and the semiconductor layer 120 may be lowered, thus reducing a contact resistivity. The electron dipole in the surface of the surface-treated semiconductor layer 120 may exceed 1.2 (a.u.).

So far, some example embodiments of a semiconductor device including a metal-2D material-semiconductor junction have been described and illustrated in the accompanying drawings to help understand the technical principle. However, it should be understood that these example embodiments are for illustrative purposes only and are not intended to be limited thereto. Also, it should be understood that the scope of the disclosure is not limited to the illustration and description. This is because various other modifications may be made by those of ordinary skill in the art.

The disclosed semiconductor device may inhibit the formation of a semiconductor oxide in the semiconductor layer by forming the metal compound on the semiconductor layer.

Since a semiconductor oxide is not formed or reduced in likelihood and/or impact from forming, a contact resistivity may be further reduced.

It should be understood that example embodiments described herein should be considered in a descriptive sense only and not for purposes of limitation. Descriptions of features or aspects within each example embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
   a metal layer;
   a semiconductor layer in electrical contact with the metal layer;
   a two-dimensional (2D) material layer between the metal layer and the semiconductor layer and having a 2D crystal structure; and
   a metal compound layer between the 2D material layer and the semiconductor layer,
   wherein a first surface of the metal compound layer contacts the 2D material layer and a second surface different from the first surface of the metal compound layer contacts the semiconductor layer, and
   wherein a difference of a reaction energy between a metal included in the metal compound layer and oxygen to a reaction energy between a semiconductor included in the semiconductor layer and oxygen is 2 eV or less,
   wherein the 2D material layer includes nanocrystalline graphene (nc-G), and
   wherein the metal compound layer includes both a metal oxide and a metal silicide.

2. The semiconductor device of claim 1, wherein the reaction energy between the metal included in the metal compound layer and oxygen is greater than the reaction energy between the semiconductor included in the semiconductor layer and oxygen.

3. The semiconductor device of claim 1, wherein the metal included in the metal compound layer includes at least one of magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), and ruthenium (Ru).

4. The semiconductor device of claim 1, wherein a thickness of the metal compound layer is about 5 nm or less.

5. The semiconductor device of claim 1, wherein the metal compound layer includes a metal-semiconductor compound.

6. The semiconductor device of claim 5, wherein the semiconductor included in the metal-semiconductor compound is the same as a semiconductor included in the semiconductor layer.

7. The semiconductor device of claim 1, wherein the 2D material layer contacts both the metal layer and the metal compound layer.

8. The semiconductor device of claim 1, wherein the metal layer includes first and second metal layers apart from each other.

9. The semiconductor device of claim 1, further comprising:
   an insulating layer on the semiconductor layer; and
   an electrode on the insulating layer.

10. The semiconductor device of claim 1, wherein the 2D material layer includes a transition metal dichalcogenide (TMD) compound.

11. The semiconductor device of claim 10, wherein the TMD compound includes at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

12. The semiconductor device of claim 1, wherein the 2D material layer includes at least one of TiOx, NbOx, MnOx, VaOx, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, InTe, hexagonal BN (h-BN), and phosphorene.

13. The semiconductor device of claim 1, wherein the 2D material layer has a doped structure having at least one of a substitution of some of elements included in the 2D crystal structure with other elements or having another element combined to the 2D crystal structure.

14. The semiconductor device of claim 1, wherein a thickness of the 2D material layer is an integral multiple of a thickness of a 2D crystal structure of a single layer.

15. The semiconductor device of claim 1, wherein the semiconductor layer includes at least one of silicon, germanium, a Group III-V compound semiconductor, a Group II-VI compound semiconductor, a Group IV-VI compound semiconductor, a Group IV-IV compound semiconductor, an oxide semiconductor, and a semiconductor having a 2D crystal structure having a band gap.

16. The semiconductor device of claim 1, wherein a surface of the semiconductor layer in electrical contact with the metal layer includes an element having an electron affinity of 4 eV or more.

17. The semiconductor device of claim 16, wherein the element having an electron affinity of 4 eV or more includes a halogen element.

* * * * *